United States Patent [19]

Moll et al.

[11] 4,388,164

[45] Jun. 14, 1983

[54] METHOD OF COATING THE SURFACE OF AN ELASTIC BODY WITH A CONTINUOUS LAYER

[75] Inventors: Eberhard Moll, Triesen, Liechtenstein; Marcel Lardon, Maienfeld, Switzerland

[73] Assignee: Balzers Aktiengesellschaft, Liechtenstein

[21] Appl. No.: 212,560

[22] Filed: Dec. 3, 1980

[30] Foreign Application Priority Data

Dec. 6, 1979 [CH] Switzerland ............ 10820/79

[51] Int. Cl.³ .................. C23C 15/00; B05D 3/12; A61F 1/00
[52] U.S. Cl. .................. 204/192 SP; 3/1.9; 204/192 C; 427/2; 427/171
[58] Field of Search ........... 427/171, 2, 175, 250; 46/87, 88; 40/214; 428/12; 3/1, 1.9, 36; 204/192 SP, 192 C, 192 D

[56] References Cited

U.S. PATENT DOCUMENTS

| 1,713,751 | 5/1929 | Dorogi et al. | 428/12 |
| 3,149,017 | 9/1964 | Ehrreich et al. | 428/12 X |
| 3,663,288 | 5/1972 | Miller | 3/1 |

FOREIGN PATENT DOCUMENTS

| 451291 | of 1936 | United Kingdom | 427/171 |
| 1226946 | 3/1971 | United Kingdom | 204/192 D |

OTHER PUBLICATIONS

Law, H. B., *Pre-Tensioned Wire*, RCA TN No. 31, Aug. 1957.

Primary Examiner—Evan K. Lawrence
Attorney, Agent, or Firm—McGlew and Tuttle

[57] ABSTRACT

With elastic, particularly rubber-elastic bodies, the problem arises that an applied coating becomes fissured upon later deformation and may easily be abraded. According to the invention, the surface to be coated, for example, an elastic implant, is held in a stretched state during the deposition of the layer, such as a metal. Then, in a state of normal use, the produced layer forms a kind of shrunken skin which remains continuous even if the body is later deformed.

7 Claims, 2 Drawing Figures

METHOD OF COATING THE SURFACE OF AN ELASTIC BODY WITH A CONTINUOUS LAYER

FIELD AND BACKGROUND OF THE INVENTION

The present invention relates to a method of coating a surface of an elastic body with a continuous layer. The invention may be applied, among others, to the coating of rubber-elastic shaped bodies, for example of silicone rubber, which are to be incorporated as implants into organic tissues. In such a case, a layer of titanium, for example, is initially applied to the shaped body, whereby the compatibility of the implant with the tissue is increased. Another field of application is contact lenses where a suitable non-absorbent coating, such as titanium oxide, is provided as a hydrophilic surface, in order to reduce an irritating effect frequently caused by uncoated contact lenses.

A recurring problem with the coating of elastically deformable bodies in in the adhesion of the applied layers. That is, the coatings tend to tear if the body is later deformed, or may be abraded due to the relative motion between the implant formed by the coated body and the surrounding tissue. Soft implants subjected to frequent deformation are particularly susceptible to abrasion.

To improve the adhesion and resistance to abrasion of layers applied in a vacuum, various measures have been taken.

It is known, for example, that with some plastic substrates, layers applied by cathode sputtering adhere better than those applied by normal evaporation. The recent methods of ion-supported vapor deposition may also be employed to improve the adhesion. Further, it may be useful to provide an adhesive layer between the substrate and the layer which insures compatibility with surrounding tissue, for example to provide a copper layer as an adhesive layer, between a substrate of silicone rubber and a metallic titanium layer as the compatible layer.

None of these prior art measures is satisfactory, however, if elastic bodies are concerned which, during use, are subjected to larger and more frequent deformations, such as implants which must follow the movements of the human body.

SUMMARY OF THE INVENTION

The present invention is directed to a method for applying a continuous layer, such as a metal, to the surface of an elastic body, which remains substantially free from cracks during later use, even under strong deformations. To this end, the body is expanded during the coating so that the surface portion to be coated is temporarily enlarged, and the layer is deposited on the area which is enlarged relative to the later normal extension of the body while in use.

Surprisingly, it has been found that layers applied in this way do not crack, not even if layers of identical material applied to rubber-elastic substrates in the same manner only without expanding the elastic body during the coating operation become fissured upon being strained and readily peel off. It may be assumed that because of the notches formed by the cracks, the adhesion of the layer is strongly reduced under frictional load. A microscopic inspection reveals that the surface of an elastic body coated in accordance with the invention forms a kind of shrunken skin with countless folds, like a gathered cloth. However, this shrunken skin is free from notches and well coherent, even though the surface of the elastic body is subjected to high local stresses due to the formed shrunken skin (these stresses, however, are rather reduced than increased by an expansive deformation of the surface).

Concerning the extent to which the substrate may be expanded during the coating, the degree of expansion by deformation of the elastic body in later use must be taken in account. The expansion during coating should at least equal, but preferably somewhat exceed, this degree, in order to reliably avoid any formation of cracks by overstraining the coat in later use. With rubber-elastic bodies, to which the invention is primarily directed, an expansion of 10% or more during the application of the layer is advisable as a general rule, at least in one direction. With tape-or-thread-like bodies, for example, stretching in the longitudinal direction alone should be satisfactory, in view of the later specific direction of the deforming load. The invention is particularly advantageous in applications where the layers to be deposited are not sufficiently ductile themselves and, in consequence, already crack on a slight overstrain. On the other hand, a too strong expansion during coating of the surface to be coated is to be avoided, especially if optical elements are involved whose function might be unfavorably effected (for example, light dispersed) by the produced shrunken skin which may be too thick. However, if the respective surface borders on a medium whose coefficient of refraction does not substantially differ from that of the layer, which may happen with contact lenses, no disturbing effect of the shrunken skin in noticeable.

Accordingly, an object of the invention is to provide a method of coating the surface of an elastic body which is deformable in use, with a continuous layer comprising temporarily expanding the body in at least one dimension whereby its surface to be coated is temporarily enlarged, and then depositing the layer on the surface which is enlarged.

Another object of the invention is to provide such a method wherein the body is hollow and expanded by being filled with a gas or liquid.

A still further object of the invention is to provide a coated elastic body which is deformable in use comprising an elastic body which has at least one surface which is first enlarged, then is coated with a coating and then returned to its original size with the coating being a shrunken skin coating.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
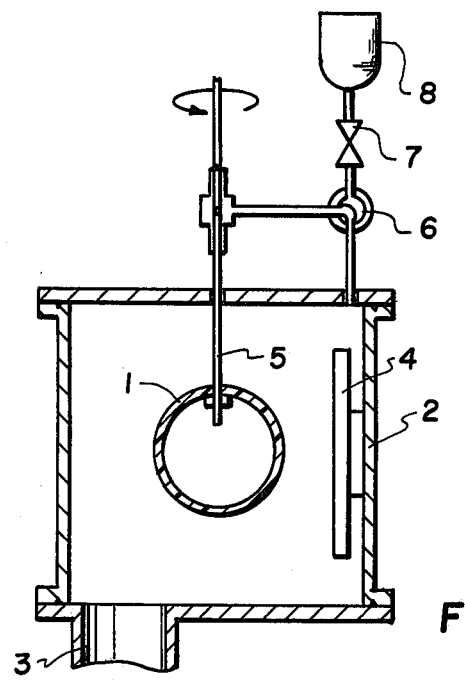
FIG. 1 is a sectional schematic representation of an apparatus used in accordance with the invention.
Figure 2:
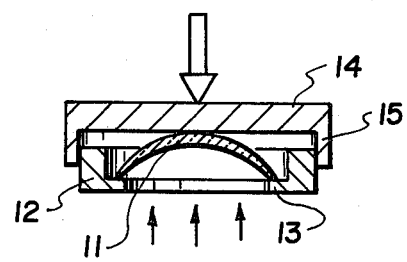
FIG. 2 is a schematic sectional view of part of an apparatus used in accordance with another embodiment of the invention.

Referring to the figures, in particular the invention embodied therein, in FIGS. 1 and 2, show apparatus for performing a method of coating an elastic body with a continuous layer which does not abrade or crack under deformation of the elastic body in use.

In FIG. 1 an elastic globule 1 is placed in a vacuum container 2 which is connectable through a connection 3 to a vacuum pump. The source of coating material is provided in the form of a schematically indicated planar magnetron 4 whose cathode is sputtered by ion bombardment. The globule 1 as a substrate to be coated, is suspended in an inflated state from a tube 5 which is vacuum-tightly and rotatably passed through the wall of the container and can be rotated during the coating operation to obtain a uniform deposit on all sides of the substrate. Globule 1 may be filled and expanded with a suitable fluid, preferably the working gas of the magnetron. It is advisable to connect the globule during the evacuation, through a three-way cock 6, to the container 2, to securely avoid exposing it to an excessive differential pressure at any time. Upon producing a vacuum necessary for the coating operation, the three-way cock is turned to connect globule 1 through a metering valve 7 to a gas cylinder 8. In this position, gas is introduced in an amount to obtain the desired explanation. Cock 6 is then shut off and the coating operation is carried out while rotating the substrate or globule 1. As soon as the desired thickness of the coating, for example 0.1 microns, is reached, the magnetron is switched off and globule 1 is connected again through cock 6 to the container 2 which is then aerated to remove the finished coated body.

If an elastic hollow body is to be filled with a liquid, a very effective cooling may be obtained during the coating operation. However, the liquid should have a vapor pressure which is negligible relative to the pressure desirable during the operation. Gas bubbles in the filling liquid are to be avoided if a uniform cooling of the surface to be coated is desired. In such a case, the simplest way again to use the invention is to initially evacuate the hollow body and then to introduce the liquid as mentioned above with regard to a filling with gas.

A suitable method for applying the layer is disclosed in U.S. Pat. No. 3,197,175 (Swiss patent application No. 006 688/77). Also usable are conventional method known already for a long time, such as the vacuum evaporation from a resistance-heated crucible, the classic cathode sputtering, deposition of layers from the gas phase, and others. During the deposition, prior art measures for improving the adhesion may be provided in addition, for example a satisfactory initial cleaning of the substrate surfaces, preliminary degassing by heating or electron bombardment, removal of the uppermost layer of the substrate by cathodic etching, or applying a biasing voltage (if the substrates are sufficiently electrically conductive).

If the body is not hollow, the inventive method may still be applied, provided that it is possible in someway during the deposition to expand or enlarge in at least one dimension, the surface to be coated. For example, elastic foils may be sealed to each other prior to the deposition, to form hollow bodies (bags), and then coated as such, and if desired, cut apart again. Parts made of elastic material may temporarily be formed into hollow bodies, with the aid of auxiliary bodies. Frequently the surface may be stretched without forming a hollow body, by means of a suitable holding device. For example, flat plates may be bent by means of a clamping mechanism so as to expand the convex side. Thread-or tape-like elastic substrates may be moved past the evaporative source in longitudinally stretched state.

FIG. 2 shows how the surface of a contact lens to be coated may be extended by means of a special holding device. The body 11 of the lens which is to be provided on its concave side with a hydrophilic coating, is placed in a retaining ring 12 having a shoulder 13, and exposed to pressure exerted from the convex side by means of a plate 14. As a result, the concave side is expanded. The pressure and, consequently, the expansion may be adjusted by means of a threaded flange 15 of plate 14, cooperating with a mating external thread of retaining ring 12.

While specific embodiments of the invention have been shown and described in detail to illustrate the application of the principles of the invention, it will be understood that the invention may be embodied otherwise without departing from such principles.

What is claimed is:

1. A method of coating the surface of an elastic implant which surface is deformable in use by a particular maximum amount, the coating being sufficiently ductile to deform with the surface without cracking, and the coating being a continuous layer of metal on the surface, which metal is not otherwise sufficiently ductile to deform with deformation of the implant surface in use without cracking, comprising:
   temporarily expanding the implant in at least one dimension to temporarily enlarge said surface to be coated by at least an amount equal to said maximum amount of deformation in use;
   then depositing said layer of metal on the surface which is enlarged by sputtering in a vacuum; and
   returning the implant to its non-expanded state; whereby the layer of metal on the surface will accept deformation of the implant in use, without cracking.

2. A method according to claim 1, wherein the surface to be coated is enlarged at least in one direction by at least 10% of its length in that direction.

3. A method according to claim 1, wherein the implant is an elastic hollow body, and wherein, during the coating, the body is held in an expanded state by a gas filling the hollow body under pressure.

4. A method of coating the surface of an elastic implant which surface is deformable in use by a particular maximum amount, the coating being sufficiently ductile to deform with the surface without cracking, and the coating being a continuous layer of material on the surface, which material is not otherwise sufficiently ductile to deform with deformation of the implant surface in use without cracking, comprising:
   temporarily expanding the implant in at least one dimension to temporarily enlarge said surface to be coated by at least an amount equal to said maximum amount of deformation in use;
   then depositing said layer of material on the surface which is enlarged, said layer of material being metal;
   returning the implant to its non-expanded state whereby the layer of metal on the surface will accept deformation of the implant in use, without cracking.

5. A method according to claim 4, wherein said metal is titanium.

6. A method according to claim 4, wherein the metal is cathode sputtered to produce a coating having a thickness of about 0.1 microns.

7. A method of coating the surface of an elastic implant which surface is deformable in use by a particular maximum amount, the coating being sufficiently ductile to deform with the surface without cracking, and the coating being a continuous layer of material on the surface, which material is not otherwise sufficiently ductile to deform with deformation of the implant surface in use without cracking, comprising:
- temporarily expanding the implant in at least one dimension to temporarily enlarge said surface to be coated by at least an amount equal to said maximum amount of deformation in use;
- then depositing said layer of material on the surface which is enlarged, said layer of material being titanium oxide; and
- returning the implant to its non-expanded state whereby the layer of titanium oxide on the surface will accept deformation of the implant in use, without cracking.

* * * * *